(12) United States Patent
Du

(10) Patent No.: US 10,790,463 B2
(45) Date of Patent: Sep. 29, 2020

(54) LIGHT EMITTING DEVICE

(71) Applicant: Najing Technology Corporation Limited, Hangzhou, Zhejiang (CN)

(72) Inventor: Yong Du, Zhejiang (CN)

(73) Assignee: Najing Technology Corporation Limited, Hangzhou, Zhejiang (CN)

(*) Notice: Subject to any disclaimer, the term of this patent is extended or adjusted under 35 U.S.C. 154(b) by 0 days.

(21) Appl. No.: 16/325,398

(22) PCT Filed: Aug. 29, 2017

(86) PCT No.: PCT/CN2017/099524
§ 371 (c)(1),
(2) Date: Feb. 14, 2019

(87) PCT Pub. No.: WO2018/041103
PCT Pub. Date: Mar. 8, 2018

(65) Prior Publication Data
US 2019/0198787 A1 Jun. 27, 2019

(30) Foreign Application Priority Data
Aug. 31, 2016 (CN) .......................... 2016 1 0797825

(51) Int. Cl.
*H01L 51/50* (2006.01)
*H01L 51/52* (2006.01)

(52) U.S. Cl.
CPC ............ *H01L 51/502* (2013.01); *H01L 51/50* (2013.01); *H01L 51/52* (2013.01); *H01L 2251/533* (2013.01); *H01L 2251/5315* (2013.01)

(58) Field of Classification Search
CPC ........ H01L 51/502; H01L 51/50; H01L 51/52
(Continued)

(56) References Cited

U.S. PATENT DOCUMENTS

2006/0138941 A1 6/2006 Wittmann
2015/0102291 A1* 4/2015 Park .................... H01L 27/3216
257/40
(Continued)

FOREIGN PATENT DOCUMENTS

CN 101821851 A 9/2010
CN 103227189 A 7/2011
(Continued)

OTHER PUBLICATIONS

European Search Report with the same priority application which dated Feb. 19, 2020.

*Primary Examiner* — Igwe U Anya
(74) *Attorney, Agent, or Firm* — Gang Yu

(57) ABSTRACT

Embodiments disclosed herein relate to a light emitting device, comprising a first substrate, a pixel isolation structure, electroluminescent structures, and a second substrate, the first substrate and the second substrate are oppositely disposed, and the second substrate is disposed on one side of pixel isolation structure far away from the first substrate, the pixel isolation structure is disposed on the surface of one side of first substrate, the pixel isolation structure forms a plurality of mutually isolated sub-pixel regions on the surface of first substrate, electroluminescent structures are disposed on a portion of first substrate corresponding to each sub-pixel region, the sub-pixel regions further comprise: a quantum dot layer disposed in at least one sub-pixel region, wherein quantum dot layer in each sub-pixel region is located on one side of electroluminescent structures far away from first substrate or located between electroluminescent structure and first substrate.

10 Claims, 3 Drawing Sheets

(58) Field of Classification Search
USPC .......................................................... 257/40
See application file for complete search history.

(56) References Cited

U.S. PATENT DOCUMENTS

| | | |
|---|---|---|
| 2015/0185381 A1 | 7/2015 | Wu et al. |
| 2016/0190497 A1 | 6/2016 | Lee et al. |
| 2016/0197232 A1* | 7/2016 | Bour ........................ H01L 33/24 257/13 |
| 2018/0175316 A1* | 6/2018 | Chen ...................... H01L 51/502 |
| 2018/0190625 A1* | 7/2018 | Steckel ............. G02F 1/133603 |

FOREIGN PATENT DOCUMENTS

| | | |
|---|---|---|
| CN | 203250739 A | 10/2013 |
| CN | 103472513 A | 12/2013 |
| CN | 203658706 A | 6/2014 |
| CN | 104143564 | 11/2014 |
| CN | 105428546 A | 3/2016 |
| CN | 105576004 A | 5/2016 |
| CN | 105590945 A | 5/2016 |
| CN | 105609656 A | 5/2016 |
| CN | 106340597 A | 1/2017 |
| WO | 2016098954 A | 6/2016 |
| WO | 2016098954 A1 | 6/2016 |

* cited by examiner

LIGHT EMITTING DEVICE

CROSS REFERENCE TO RELATED APPLICATIONS

This application is a national application of PCT/CN2017099524, filed on Aug. 29, 2017. The contents of PCT/CN2017099524 are all hereby incorporated by reference.

TECHNICAL FIELD

The present disclosure relates to the field of optical technologies, and in particular to a light emitting device.

BACKGROUND

The application of quantum dots in display devices mainly includes quantum dot photoluminescent backlight system and quantum dot electroluminescent structure (QLED). At present, since the quantum dot efficiency of the quantum dot electroluminescent structure still does not meet the market demand, people have begun to explore a light emitting device combining photoluminescence and electroluminescence, wherein an electroluminescent sub-pixel corresponds to a photoluminescent quantum dot layer, and a light with a first wavelength generated after the electroluminescent sub-pixel is energized passes through the photoluminescent quantum dot layer to generate a light with a second wavelength.

For the aforesaid light emitting device, when the photoluminescent quantum dot layer array film is disposed on the inner side of the top substrate of the electroluminescent structure, in the prior art, it is generally required to provide a black matrix between the photoluminescent quantum dot layers to prevent the sub-pixel of the electroluminescent structure from exciting adjacent photoluminescent quantum dot layers to emit light. However, the black matrix has a disadvantage of absorbing light, thereby reducing the luminous efficiency of the light emitting device.

SUMMARY

A main object of the present disclosure is to provide a light emitting device to solve the problem that the light emitting device of the prior art has low luminous efficiency due to having a black matrix.

To realize the above object, according to one aspect of the present disclosure, a light emitting device comprises a first substrate, a pixel isolation structure, electroluminescent structures, and a second substrate, the first substrate and the second substrate are oppositely disposed, and the second substrate is disposed on one side of the pixel isolation structure far away from the first substrate, the pixel isolation structure is disposed on the surface of one side of the first substrate, the pixel isolation structure forms a plurality of mutually isolated sub-pixel regions on the surface of the first substrate, the electroluminescent structures are disposed on a portion of the first substrate corresponding to each sub-pixel region, wherein the sub-pixel regions further comprise: a quantum dot layer disposed in at least one the sub-pixel region, wherein the quantum dot layer in each sub-pixel region is located on one side of the electroluminescent structures far away from the first substrate or located between the electroluminescent structure and the first substrate.

Further, a width of the quantum dot layer in each sub-pixel region is greater than or equal to a width of an effective light emitting region of the electroluminescent structure.

Further, the light emitting device comprises first padding portions, the quantum dot layer in each sub-pixel region is located on one side of the electroluminescent structure far away from the first substrate, the first padding portion and the quantum dot layer are disposed in different sub-pixel regions, and is located between the first substrate and the electroluminescent structure, or the quantum dot layer in each sub-pixel region is located between the electroluminescent structure and the first substrate, the first padding portion is disposed in the sub-pixel region having the quantum dot layer, and is located between the quantum dot layer and the first substrate.

Further, the electroluminescent structure comprises a light emitting layer, the first padding portion and the quantum dot layer are disposed in the different sub-pixel regions, the shortest distance between the surface of the quantum dot layer and the surface of the first substrate being a first distance, the shortest distance between the surface of the light emitting layer located in the sub-pixel region as same as the first padding portion and the surface of the first substrate being a second distance, the first distance is less than or equal to the second distance, or the first padding portion is disposed in the sub-pixel region having the quantum dot layer, the shortest distance between the surface of the quantum dot layer and the surface of the first substrate being a first distance, the shortest distance between the surface of the light emitting layer located in the sub-pixel region different from the first padding portion and the surface of the first substrate being a second distance, the first distance is greater than or equal to the second distance.

Further, the first padding portion is a transparent insulating layer, preferably a $SiO_2$ layer or a polyimide layer.

Further, the light emitting device comprises second padding portions, the quantum dot layer in each the sub-pixel region is located on one side of the electroluminescent structure far away from the first substrate, the second padding portion is disposed between the second substrate and the quantum dot layer, or the quantum dot layer is located between the electroluminescent structure and the first substrate, the second padding portion is disposed between the electroluminescent structure and the quantum dot layer.

Further, the electroluminescent structure comprises a light emitting layer, the shortest distance between the surface of the quantum dot layer and the surface of the first substrate being a first distance, the shortest distance between the surface of the light emitting layer located in the sub-pixel region different from the second padding portion and the surface of the first substrate being a third distance, the second padding portion is disposed between the second substrate and the quantum dot layer, the first distance is less than the third distance, or the second padding portion is disposed between the electroluminescent structure and the quantum dot layer located in the same sub-pixel region, the first distance is greater than the third distance.

Further, the second padding portion is a transparent insulating layer, preferably a $SiO_2$ layer or a polyimide layer.

Further, the emitted light of the electroluminescent structure is blue light, and the quantum dot layer has red quantum dots and/or green quantum dots.

Further, the electroluminescent structure is a QLED or an OLED.

According to the technical solution of the present disclosure, a light emitting device including a first substrate, a pixel isolation structure, and electroluminescent structures and a second substrate is provided. The pixel isolation structure has a plurality of mutually isolated sub-pixel regions, and the electroluminescent structures are disposed on portion of the first substrate corresponding to each sub-pixel region. The light emitting device further includes a quantum dot layer disposed in at least one sub-pixel region, and the quantum dot layer in each sub-pixel region is located on one side of the electroluminescent structure far away from the first substrate or between the electroluminescent structure and the first substrate, thereby being able to isolate the quantum dot layers having quantum dots of different colors through the pixel isolation structure, so that there is no need to provide a black matrix between adjacent quantum dot layers, thus effectively preventing the sub-pixels of the electroluminescent structures from exciting adjacent photoluminescent quantum dot layers to emit light, which can avoid the absorption of light by the black matrix and improve the luminous efficiency of the light emitting device.

BRIEF DESCRIPTION OF THE DRAWINGS

The accompanying figures, constituting a part of this invention, are intended to provide a further understanding of the invention, and the illustrative embodiments of the present disclosure and the description thereof are intended to explain the present disclosure and are not intended to limit the invention. In the accompanying figures.

10. First Substrate; 20. Pixel Isolation Structure; 30. Electroluminescent Structure; 40. Second Substrate; 50. Quantum Dot Layer; 60. First Padding Portion; 70. Second Padding Portion.

DETAILED DESCRIPTION

It should be noted that the embodiments of the present disclosure and the features of the embodiments may be combined with each other in case of no conflict. The invention will be described in detail below with reference to the figures and in conjunction with the embodiments.

In order to enable a person skilled in the art to have a better understanding of the solution of the present disclosure, the technical solutions in the embodiments of the present disclosure will be clearly and completely described below with reference to the figures, but obviously, the described embodiments are merely a part of the embodiments of the invention rather than all of the embodiments. All other embodiments obtained by a person of ordinary skill in the art based on the embodiments of the present disclosure without creative efforts should fall within the scope of the present disclosure.

It should be noted that the terms "first", "second", and the like in the specification and claims of the present disclosure are used to distinguish similar objects, and are not necessarily used to describe a particular order or sequence. It should be understood that the number so used may be interchangeable when appropriate to facilitate the description of embodiments of the invention disclosed herein. Furthermore, the terms "comprise" and "have", as well as any variants thereof, are intended to cover a non-exclusive inclusion, for example, processes, methods, systems, products, or devices that include a series of steps or units are not necessarily limited to include those steps or units explicitly listed, and may include other steps or units not explicitly listed or inherent to such processes, methods, products or devices.

Figure 1:
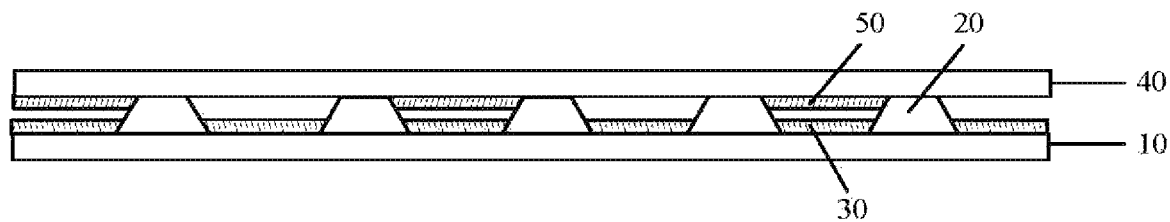
FIG. 1 shows a cross-sectional structural view of a light emitting device in which the light emitting device according to an embodiment of the present disclosure is a top emitting device.
Figure 2:
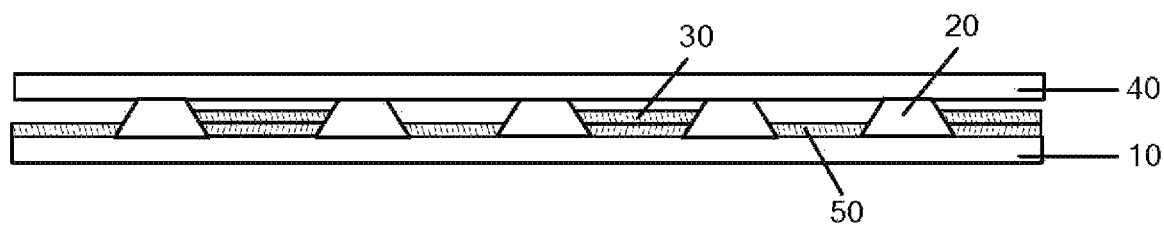
FIG. 2 shows a cross-sectional structural view of a light emitting device in which the light emitting device according to an embodiment of the present disclosure is a bottom emitting device.
Figure 3:
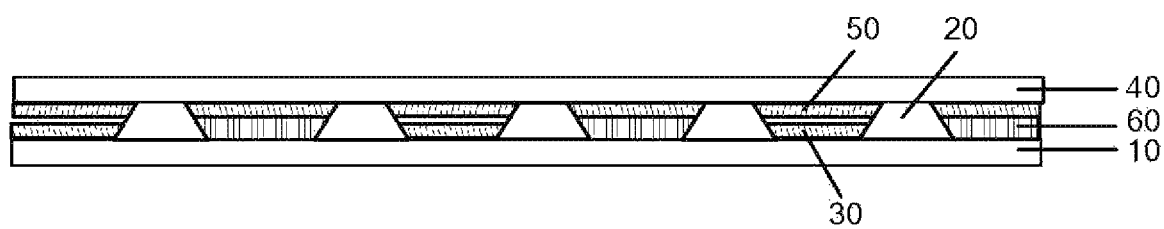
FIG. 3 shows a cross-sectional view of a light emitting device in which the light emitting device according to an embodiment of the present disclosure is a top emitting device and includes first padding portions.
Figure 4:
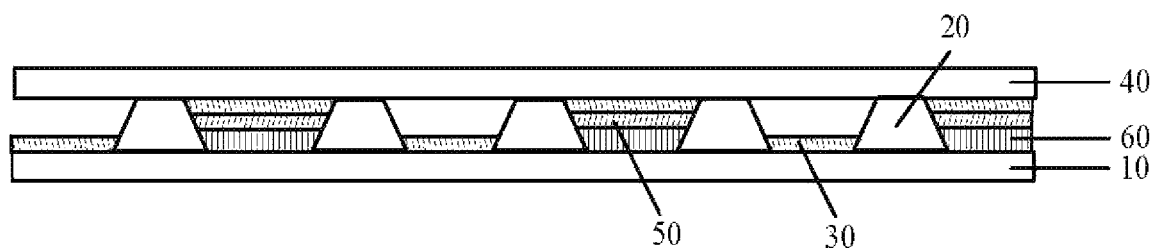
FIG. 4 shows a cross-sectional view of a light emitting device in which the light emitting device according to an embodiment of the present disclosure is a bottom emitting device and includes first padding portions.

As described in the prior art, the black matrix disposed between the photoluminescent quantum dot layers in the prior art has the disadvantage of absorbing light, thereby reducing the luminous efficiency of the light emitting device. The inventor of the present application has done researches on the aforesaid problems, and provides a light emitting device, as shown in FIGS. 1 to 6, including a first substrate 10, a pixel isolation structure 20, an electroluminescence structure 30, and a second substrate 40. The first substrate 10 and the second substrate 40 are oppositely disposed, and the second substrate 40 is disposed on one side of the pixel isolation structure 20 far away from the first substrate 10; The pixel isolation structure 20 is disposed on the surface of one side of the first substrate 10, and the pixel isolation structure 20 forms a plurality of mutually isolated sub-pixel regions on the surface of the first substrate 10; the electroluminescent structures 30 are disposed on a portion of the first substrate 10 corresponding to each sub-pixel region, and the sub-pixel regions further include: a quantum dot layer 50, disposed in at least one sub-pixel region, and the quantum dot layer 50 in each sub-pixel region is located on one side of the electroluminescent structure 30 far away from the first substrate 10 (as shown in FIGS. 1 and 3) or between the electroluminescent structure 30 and the first substrate 10 (as shown in FIGS. 2 and 4).

The light emitting device of the present disclosure includes a quantum dot layer disposed in at least one sub-pixel region, and the quantum dot layer in each sub-pixel region is located on one side of the electroluminescent structure far away from the first substrate or between the electroluminescent structure and the first substrate, thereby being able to isolate the quantum dot layers having quantum dots of different colors through the pixel isolation structure, so that there is no need to provide a black matrix between adjacent quantum dot layers, thus effectively preventing the sub-pixels of the electroluminescent structure from exciting adjacent photoluminescent quantum dot layers to emit light, which can avoid the absorption of light by the black matrix and improve the luminous efficiency of the light emitting device.

The sizes of the first substrate 10 and the second substrate 40 in the aforesaid embodiments may be the same or different, and the opposite disposition of the first substrate 10 and the second substrate 40 is not limited to a disposition in which the first substrate 10 and the second substrate 40 are aligned, and may be a disposition in which the first substrate 10 and the second substrate 40 having different sizes are partially overlapped. For ease of fabrication, when the quantum dot layer 50 is disposed on one side of the electroluminescent structure 30 far away from the first substrate, the quantum dot layer 50 may be directly disposed on the surface of one side of the second substrate 40 which near the electroluminescent structure 30, and the quantum dot layer 50 can also be disposed directly on the surface of the electroluminescent structure 30.

In the aforesaid light emitting device disclosed by the present disclosure, the aforesaid second substrate 40 serves as a cover plate to protect the pixel isolation structure 20, the electroluminescent structure 30, and the quantum dot layer 50; Moreover, in the manufacturing process of the aforesaid light emitting device, the pixel isolation structure 20 may be disposed on the first substrate 10, and the electroluminescent structure 30 may be disposed in the sub-pixel region, while the quantum dot layer 50 is disposed on the second substrate 40, and then, by laminating the side of the first substrate 10 on which the pixel isolation structure 20 is disposed and the side of the second substrate 40 on which the quantum dot layer 50 is disposed, a top-emitting light emitting device can be obtained, thereby simplifying the manufacturing process of the light emitting device.

In the aforesaid light emitting device disclosed by the present disclosure, the first substrate 10 is a TFT substrate, and the TFT substrate controls the switching of each sub-pixel by disposing a thin film transistor on a glass or a polymer substrate; the electroluminescent structure 30 includes a first electrode layer, a light emitting layer and a second electrode layer which are sequentially stacked on the first substrate 10, and may further includes a functional layer disposed between the light emitting layer and the first electrode layer and/or between the light emitting layer and the second electrode layer, the functional layer may selected from any one or more of the group consisting of a hole injection layer, a hole transport layer, an electron transport layer, and an electron injection layer. Those skilled in the art can select the types of functional layer in the electroluminescent structure 30 according to the desired needs.

Moreover, the electroluminescent structure 30 in the aforesaid light emitting device disclosed by the present disclosure may be classified into top-emitting light emitting device and bottom-emitting light emitting device according to different light emitting directions. When the first electrode layer of the electroluminescent structure 30 is a reflective electrode, and the second electrode layer is a transmissive electrode, the aforesaid electroluminescent structure 30 is a top-emitting light emitting structure, as shown in FIG. 1; when the first electrode layer of the electroluminescent structure 30 is a transmissive electrode, and the second electrode layer is a reflective electrode, the aforesaid electroluminescent structure 30 is a bottom-emitting light emitting structure, as shown in FIG. 2.

In some embodiments, the emitted light from the electroluminescent structure 30 is blue light, and the quantum dot layer 50 has red quantum dots and/or green quantum dots. Blue light is emitted through the electroluminescent structure 30, and the red quantum dots and/or the green quantum dots in the quantum dot layer 50 are excited to emit red light and/or green light, thereby obtaining the emitted light of different colors or mixed colors thereof. Also, the aforesaid electroluminescent structure 30 may be a QLED or an OLED (Organic Light Emitting Diode). Those skilled in the art can select the type of electroluminescent structure 30 according to the actual needs.

In some embodiments, the width of the quantum dot layer 50 in each sub-pixel region is greater than or equal to the width of the effective light emitting region of the electroluminescent structure 30. The aforesaid effective light emitting region refers to the contact area between the electroluminescent structure 30 and the first substrate 10. By making the quantum dot layer 50 have a width larger than the width of the aforesaid effective light emitting region, the emitted light of the electroluminescent structure 30 can fully be used to excite the quantum dot layer 50, thereby effectively avoiding the color deviation between the actual emitted light and the simulated emitted light of the light emitting device caused by leakage of the emitted light of the electroluminescent structure 30 from two sides of the quantum dot layer 50.

When the emitted light of the electroluminescent structure 30 is blue light, in order to prevent leakage of blue light in the light emitting device, in some embodiments, the light emitting device further includes first padding portions 60, and the quantum dot layer 50 in each sub-pixel region is located on one side of the electroluminescent structure 30 far away from the first substrate 10; as shown in FIG. 3, the first padding portion 60 and the quantum dot layer 50 are disposed in different sub-pixel regions respectively, and are located between the first substrate 10 and the electroluminescent structure 30; or as shown in FIG. 4, the quantum dot layer 50 in each sub-pixel region is located between the electroluminescent structure 30 and the first substrate 10, and the first padding portion 60 is disposed in the sub-pixel region having the quantum dot layer 50 and located between the quantum dot layer 50 and the first substrate 10.

In some embodiments, the electroluminescent structure 30 includes a light emitting layer. In some embodiments, the first padding portion 60 and the quantum dot layer 50 are disposed in different sub-pixel regions respectively, the shortest distance between the surface of the quantum dot layer 50 and the surface of the first substrate 10 being a first distance, the shortest distance between the surface of the light emitting layer located in the sub-pixel region as same as the first padding portion 60 and the surface of the first substrate 10 as a second distance, the first distance is less than or equal to the second distance, and when the first distance is equal to the second distance, the top emitting device as shown in FIG. 3 is formed, or the first padding portion 60 is disposed in a sub-pixel region having the quantum dot layer 50, the shortest distance between the surface of the quantum dot layer 50 and the surface of the first substrate 10 being a first distance, the shortest distance between the surface of the light emitting layer located in the sub-pixel region different from the first padding portion 60 and the surface of the first substrate 10 being a second distance, the first distance is greater than or equal to the second distance, and when the first distance is greater than the second distance, the bottom emitting device as shown in FIG. 4 is formed. By providing the first padding portion 60, the light emitting surface of the quantum dot layer 50 and the light emitting surface of the light emitting layer in the electroluminescent structure 30 located in different sub-pixel regions can be at the same horizontal level, or the distance from the light emitting surface of the light emitting layer in the electroluminescent structure 30 to the actual light emitting surface (such as the second substrate of the top emitting device or the first substrate of the bottom emitting device) is less than the distance from the light emitting surface of the quantum dot layer 50 to the actual light emitting surface, thereby further reducing the leakage of blue light to avoid red or/and green quantum layers in adjacent sub-pixel regions to be excited which causes RGB blending deviation, for avoiding the influence of color blending on the light emitting quality of the device and improving the color blending accuracy of the light emitting device.

In order to reduce the influence of the first padding portion 60 on the luminous efficiency of the light emitting device, in some embodiments, the first padding portion 60 is a transparent insulating layer, wherein the term "transparent" means that the transparent insulating layer is transparent to visible light at least, and the transmittance of the transparent insulating layer may be 30% or more, so that when the first padding portion 60 is disposed on the light emitting surface of the electroluminescent structure 30, more of the emitted light of the light emitting layer in the electroluminescent structure 30 can travel through the first padding portion 60 instead of being reflected back into the electroluminescent structure 30. In some embodiments, the first padding portion 60 is a $SiO_2$ layer or a polyimide layer. These types of material may further reduce the influence of the first padding portion 60 on the luminous efficiency of the light emitting device.

Figure 5:
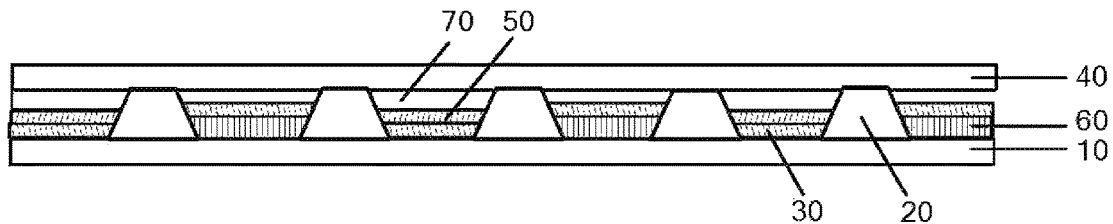
FIG. 5 shows a cross-sectional view of a light emitting device in which the light emitting device according to an embodiment of the present disclosure is a top emitting device and includes first padding portions and second padding portions.
Figure 6:
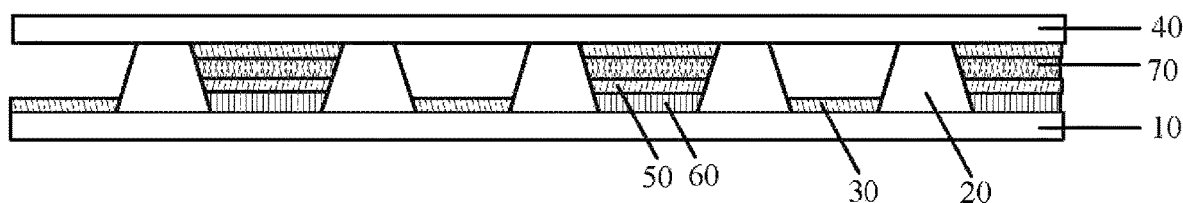
FIG. 6 shows a cross-sectional view of a light emitting device in which the light emitting device according to an embodiment of the present disclosure is a bottom emitting device and includes first padding portions and second padding portions.

In some embodiments, the aforesaid first padding portion 60 is included in the aforesaid light emitting device present disclosure, in order to further prevent leakage of blue light in the light emitting device, the light emitting device further includes second padding portions 70, the quantum dot layer 50 in each sub-pixel region is located on one side of the electroluminescent structure 30 far away from the first substrate 10, and the second padding portion 70 is disposed between the second substrate 40 and the quantum dot layer 50, as shown in FIG. 5; or the quantum dot layer 50 is located between the electroluminescent structure 30 and the first substrate 10, and the second padding portion 70 is disposed between the electroluminescent structure 30 and the quantum dot layer 50 located in the same sub-pixel region, as shown in FIG. 6.

In some embodiments, the electroluminescent structure 30 includes a light emitting layer, the second padding portion 70 is disposed between the second substrate 40 and the quantum dot layer 50, and a first distance defined as the shortest distance between the surface of the quantum dot layer 50 and the surface of the first substrate 10, a third distance defined as the shortest distance between the surface of the light emitting layer in the electroluminescent structure 30 in the sub-pixel region different from the second padding portion 70 and the surface of the first substrate 10, the first distance is less than the third distance, forming a top emitting device as shown in FIG. 5, or the second padding portion 70 is disposed between the electroluminescent structure 30 and the quantum dot layer 50 in the same sub-pixel region, and the first distance is greater than the third distance, forming a bottom emitting device as shown in FIG. 6. By providing the first padding portion 60 and the second padding portion 70, the light emitting surface of the quantum dot layer 50 has a lower level than the light emitting surface of the light emitting layer of the electroluminescent structure 30 which located in the different sub-pixel region, thereby effectively reducing the leakage of blue light and further improve the brightness and brightness uniformity of the light emitting device.

Similarly, in order to reduce the influence of the second padding portion 70 on the luminous efficiency of the light emitting device, in some embodiments, the second padding portion 70 is a transparent insulating layer wherein the aforesaid term "transparent" means that the transparent insulating layer is transparent to visible light at least, and the transmittance of the transparent insulating layer may be 30% or more, and the material may be selected from the group consisting of one or more of $SiO_2$, polyethersulfone (PES), polyacrylic acid (PAA), polyarylate (PAR), polyetherimide (PEI), polyethylene naphthalate (PEN), polyethylene terephthalate (PET), polyphenylene sulfide (PPS), polyimide (PI), polycarbonate (PC), cellulose acetate (CA) and cellulose acetate propionate (CAP), so that when the second padding portion 70 is disposed on the light emitting surface of the quantum dot layer 50, more of the emitted light of the quantum dot layer 50 can travel through the second padding portion 70 instead of being reflected back into the quantum dot layer 50. More preferably, the aforesaid second padding portion 70 is a $SiO_2$ layer or a polyimide layer. The aforesaid preferred type can further reduce the influence of the first padding portion 60 on the luminous efficiency of the light emitting device.

In addition, it should be noted that the quantum dot layer is not disposed above some of the electroluminescent structures in the accompanying figures of the present application, that is, the light of the electroluminescent structure will be directly utilized without undergoing light conversion; in fact, an Optical Clear Resin (OCR) layer may be disposed above the electroluminescent structure for direct light transmitting, and the OCR layer may be cured by ultraviolet light.

According to another aspect of the present disclosure, there is also provided a display device including the aforesaid light emitting device. The light emitting device in the aforesaid display device further includes a quantum dot layer disposed in at least one sub-pixel region, and the quantum dot layer in each sub-pixel region is located on one side of the electroluminescent structure far away from the first substrate or between the electroluminescent structure and the first substrate, thereby being able to isolate the quantum dot layers having quantum dots of different colors through the pixel isolation structure, so that there is no need to provide a black matrix between adjacent quantum dot layers, thus effectively preventing the sub-pixels of the electroluminescent structure from exciting adjacent photoluminescent quantum dot layers to emit light, which can effectively solve the chromatic aberration problem generated by the display device.

The light emitting device disclosed by the present disclosure will be further described below in conjunction with the embodiments.

EMBODIMENTS

Embodiment 1

The light emitting device provided in this embodiment is a top emitting device, including a first substrate, a pixel isolation structure, an electroluminescent structure, a quantum dot layer and a second substrate, wherein the second substrate is disposed opposite to the first substrate, and the pixel isolation structure is disposed on the surface of one side of the first substrate, and the second substrate is disposed on one side of the pixel isolation structure far away from the first substrate; the pixel isolation structure isolates pixels on the first substrate to form six sub-pixel regions including three types of sub-pixel region, namely, R, G, and B, wherein the part of the first substrate corresponding to the B (blue) sub-pixel region is only disposed with the electroluminescent structure, and the R (red) sub-pixel region and the G (green) sub-pixel region adjacent to the B sub-pixel region are further disposed with the quantum dot layer; the electroluminescent structure in each sub-pixel region is located between the quantum dot layer and the first substrate, and the width of the quantum dot layer in each sub-pixel region is smaller than the width of the effective light emitting region of the electroluminescent structure.

Wherein, the first substrate is a TFT (Thin Film Transistor) substrate, and the second substrate is glass. The electroluminescent structure includes a first electrode layer, a first functional layer, a light emitting layer, a second functional layer, a third functional layer and a second electrode layer which are sequentially stacked. The material forming the first electrode layer (cathode) is Ag; the material of the first functional layer is ZnO nanoparticles; the material of the second functional layer is polyvinyl carbazole (PVK); the material of the third functional layer is poly(3,4-ethyl-enedioxythiophene)-polystyrenesulfonic acid (PEDOT:PSS); the second electrode layer is indium tin oxide (ITO) as an anode; the material of the light emitting layer in the electroluminescent structure is blue quantum dots; the quantum dot layer includes a red quantum dot layer having red quantum dots and a polyurethane resin as a matrix, and a green quantum dot layer having green quantum dots and a polyurethane resin as a matrix; The blue, red, and green quantum dots are CdSe/ZnS core-shell quantum dots of different sizes.

Embodiment 2

The difference of the light emitting device provided in this embodiment and Embodiment 1 is as follows:

The width of the quantum dot layer in each sub-pixel region is greater than the width of the effective light emitting region of the electroluminescent structure.

Embodiment 3

The difference of the light emitting device provided in this embodiment and Embodiment 2 is as follows:

The light emitting device further includes first padding portion, wherein the quantum dot layer in each sub-pixel region is located on one side of the electroluminescent structure far away from the first substrate, and the first padding portion and the quantum dot layer are disposed in different sub-pixel regions respectively and located between the first substrate and the electroluminescent structure, a first distance defined as the shortest distance between the surface of the quantum dot layer and the surface of the first substrate, a second distance defined as the shortest distance between the surface of the light emitting layer located in the same sub-pixel region as the first padding portion and the surface of the first substrate, the first distance is equal to the second distance, wherein the first padding portion is a $SiO_2$ layer.

Embodiment 4

The difference of the light emitting device provided in this embodiment and Embodiment 3 is as follows:

The light emitting device further includes second padding portions which are disposed between the second substrate and the quantum dot layer, with the first distance smaller than a third distance defined as the shortest distance between the surface of the light emitting layer in a different sub-pixel regions from the second padding portion and the surface of the first substrate, wherein the first padding portion is a $SiO_2$ layer.

Embodiment 5

The light emitting device provided in this embodiment is a bottom emitting device, including a first substrate, a pixel isolation structure, an electroluminescent structure, a quantum dot layer and a second substrate, wherein the second substrate is disposed opposite to the first substrate, and the pixel isolation structure is disposed on the surface of one side of the first substrate, and the second substrate is disposed on one side of the pixel isolation structure far away from the first substrate; the pixel isolation structure isolates pixels on the first substrate to form six sub-pixel regions including three types of sub-pixel region, namely, R, G, and B, wherein the part of the first substrate corresponding to the B (blue) sub-pixel region is only disposed with the electroluminescent structure, and the R (red) sub-pixel region and the G (green) sub-pixel region adjacent to the B sub-pixel region are further disposed with the quantum dot layer; and the quantum dot layer in each sub-pixel region is located between the electroluminescent structure and the first substrate, and the width of the quantum dot layer in each sub-pixel region is smaller than the width of the effective light emitting region of the electroluminescent structure.

Wherein, the first substrate is a TFT substrate, and the second substrate is glass. The electroluminescent structure includes a first electrode layer, a first functional layer, a second functional layer, a light emitting layer, a third functional layer and a second electrode layer which are sequentially stacked. The first electrode layer is ITO (anode); the material of the first functional layer is PEDOT:PSS; the material of the second functional layer is PVK; and the material of the third functional layer is ZnO nanoparticles; the material forming the second electrode layer is Ag (reflective cathode); the material of the light emitting layer in the electroluminescent structure includes blue quantum dots; the quantum dot layer includes a red quantum dot layer having red quantum dots and a polyurethane resin as a matrix, and a green quantum dot layer having green quantum dots and a polyurethane resin as a matrix; The blue, red, and green quantum dots are CdSe/ZnS core-shell quantum dots of different sizes.

Embodiment 6

The difference of the light emitting device provided in this embodiment and Embodiment 5 is as follows:

The width of the quantum dot layer in each sub-pixel region is greater than the width of the effective light emitting region of the electroluminescent structure.

Embodiment 7

The difference of the light emitting device provided in this embodiment and Embodiment 6 is as follows:

The light emitting device further includes a first padding portion, wherein the quantum dot layer in each sub-pixel region is located between the electroluminescent structure and the first substrate, and the first padding portion which is a polyimide layer is disposed in the sub-pixel region having the quantum dot layer, and located between the quantum dot layer and the first substrate, a first distance defined as the shortest distance between the surface of the quantum dot layer and the surface of the first substrate, a second distance defined as the shortest distance between the surface of the light emitting layer located in the sub-pixel region different from the first padding portion and the surface of the first substrate, the first distance is equal to the second distance.

Embodiment 8

The difference of the light emitting device provided in this embodiment and Embodiment 7 is as follows:

The light emitting device further includes second padding portions, and the quantum dot layer is located between the electroluminescent structure and the first substrate, wherein the second padding portion which is an $SiO_2$ layer is disposed between the electroluminescent structure and the quantum dot layer, with the first distance greater than a third distance defined as the shortest distance between the surface of the light emitting layer in the sub-pixel regions different from the second padding portion and the surface of the first substrate.

Comparative Embodiment 1

The light emitting device provided in the present comparative embodiment is a top emitting device, including a first substrate, a pixel isolation structure, electroluminescent structures, quantum dot layers, a black matrix and a second substrate, wherein the pixel isolation structure is disposed on the surface of one side of the first substrate, and the pixel isolation structure has the same number of mutually isolated sub-pixel regions as in Embodiment 1; a part of the first substrate corresponding to each sub-pixel region is disposed with the electroluminescence structure, and the black matrix is disposed on the surface of one side of the second substrate; and the black matrix is disposed to form mutually isolated quantum dot regions corresponding to the pixel isolation structure, and the quantum dot layers are disposed on the part of the second substrate corresponding to each quantum dot region to form a three-color RGB light emitting device.

Wherein, the first substrate is a TFT substrate, and the electroluminescent structure includes a first electrode layer, a first functional layer, a second functional layer, a light emitting layer, a third functional layer and a second electrode layer which are sequentially stacked. The material forming the first electrode layer (cathode) is Ag; the material of the first functional layer is ZnO nanoparticles; the material of the second functional layer is polyvinyl carbazole (PVK); the material of the third functional layer is poly(3,4-ethylenedioxythiophene)-polystyrenesulfonic acid (PEDOT:PSS); the second electrode layer is indium tin oxide (ITO) as an anode; the material forming the light emitting layer is blue quantum dots; the quantum dot layer includes a red quantum dot layer having red quantum dots and a polyurethane resin as a matrix, and a green quantum dot layer having green quantum dots and a polyurethane resin as a matrix; The blue, red, and green quantum dots are CdSe/ZnS core-shell quantum dots of different sizes.

Comparative Embodiment 2

The light emitting device provided in the present comparative embodiment is a bottom emitting device, including a first substrate, a pixel isolation structure, electroluminescent structures, quantum dot layers, a black matrix and a second substrate, wherein, the second substrate is disposed opposite to the first substrate, the pixel isolation structure is disposed on the surface of one side of the first substrate, and the second substrate is disposed on one side of the pixel isolation structure far away from the first substrate. The pixel isolation structure has the same number of mutually isolated sub-pixel regions as in Embodiment 5; part of the first substrate corresponding to each sub-pixel region is disposed with the electroluminescence structures, and the black matrix is disposed on the surface of one side of the second substrate; and the black matrix is disposed to form mutually isolated quantum dot regions corresponding to the pixel isolation structure, and the quantum dot layers are disposed on the part of the second substrate corresponding to each quantum dot region to form a three-color RGB light emitting device.

Wherein, the first substrate is a TFT substrate, and the second substrate is glass. The electroluminescent structure includes a first electrode layer, a first functional layer, a second functional layer, a light emitting layer, a third functional layer and a second electrode layer which are sequentially stacked. The formed first electrode layer is ITO (anode); the material of the first functional layer is poly(3,4-ethylenedioxythiophene)-polystyrenesulfonic acid (PEDOT:PSS); the material of the second functional layer is PVK; and the material of the third functional layer is ZnO nanoparticles; the material forming the second electrode layer is Ag (reflective cathode); the material forming the light emitting layer includes blue quantum dots; the quantum dot layer includes a red quantum dot layer having red quantum dots and a polyurethane resin as a matrix, and a green quantum dot layer having green quantum dots and a polyurethane resin as a matrix; The blue, red, and green quantum dots are CdSe/ZnS core-shell quantum dots of different sizes.

The EQE (external quantum efficiency) of the blue light of the electroluminescent structure in Embodiments 1 to 8 was measured using a PR670 spectrophotometer/colorimeter/radiometer manufactured by PHOTO RESEARCH, at a current density of 20 mA/cm$^2$; the blue backlight spectrum and the spectrum after the blue light passing through the quantum dot layer were respectively tested by integrating spheres, and the quantum dot photoluminescence efficiency (red quantum dot luminous efficiency and green quantum dot luminous efficiency) were calculated using the integral area of the spectrum.

Wherein, quantum dot photoluminescence efficiency= (red quantum dot absorption peak area or green quantum dot absorption peak area)/(blue backlight peak area−peak area of blue light passing through the quantum dot layer which are not absorbed)*100%.

The brightness uniformity of the light emitting devices provided in the aforesaid Embodiments 1 to 8 and Comparative Embodiments 1 and 2 was tested. The brightness of 9 points was respectively measured by the 9-point brightness test method, and then the maximum value Max and the minimum value Min of 9 points were obtained. The brightness uniformity is finally obtained by the formula (Max−Min)/(Max+Min).

The test results are as follows:

| | Electroluminescence efficiency EQE of blue quantum dots (%) | Photoluminescence efficiency of quantum dot layer | | Brightness uniformity (%) |
| --- | --- | --- | --- | --- |
| | | Luminescence efficiency of red quantum dots (%) | Luminescence efficiency of green quantum dots (%) | |
| Embodiment 1 | 8.2 | 42 | 35 | 86.16 |
| Embodiment 2 | 8.3 | 43 | 37 | 86.19 |
| Embodiment 3 | 8.7 | 44 | 42 | 87.57 |
| Embodiment 4 | 8.8 | 45 | 43 | 89.83 |
| Embodiment 5 | 8.2 | 42 | 35 | 86.17 |
| Embodiment 6 | 8.3 | 44 | 36 | 86.18 |
| Embodiment 7 | 8.7 | 45 | 43 | 87.58 |
| Embodiment 8 | 8.8 | 45 | 44 | 89.84 |
| Comparative Embodiment 1 | 7.5 | 38 | 30 | 80.23 |
| Comparative Embodiment 2 | 7.6 | 39 | 32 | 80.26 |

As can be seen from the aforesaid test results, the light emitting devices of Embodiments 1 to 8 of the present application have higher luminous efficiency and brightness uniformity compared with Comparative Embodiment 1.

Spectral tests were carried out on the blue light of the light emitting devices of Embodiment 2, Embodiment 3, and Embodiment 4 using a PR670 spectrophotometer/colorimeter/radiometer manufactured by PHOTO RESEARCH, at a current density of 20 mA/cm² for verifying whether the blue pixel emits a spectrum only including blue spectral peaks to check whether blue light leakage occurs.

Comparison of Embodiment 2, Embodiment 3 and Embodiment 4

Figure 7:
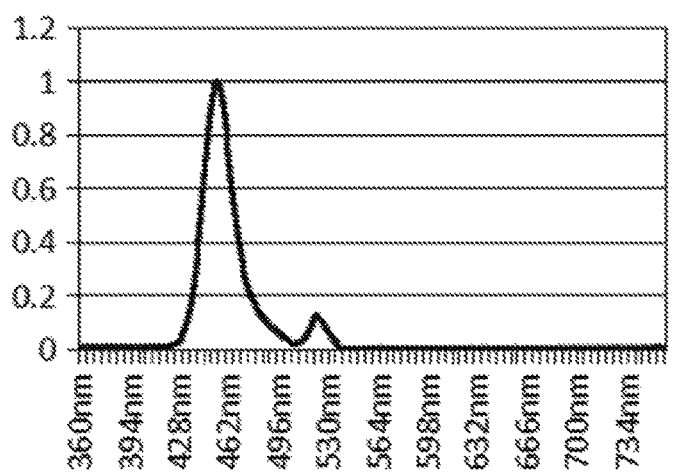
FIG. 7 shows the blue light spectrum of a light emitting device in Embodiment 2 of the present disclosure.
Figure 8:
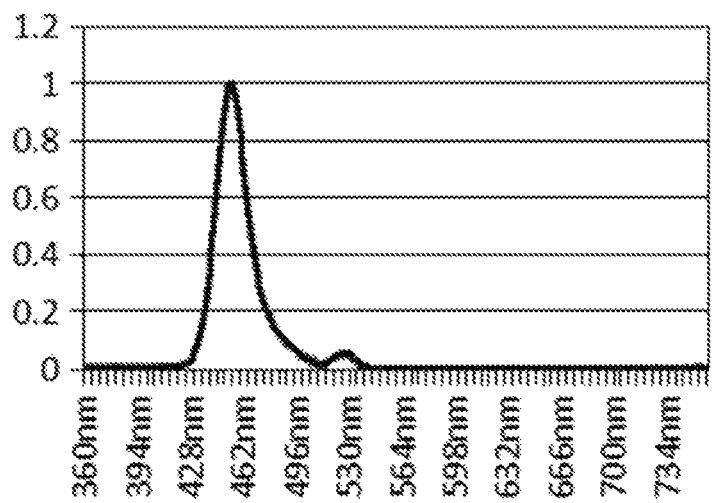
FIG. 8 shows the blue light spectrum of a light emitting device in Embodiment 3 of the present disclosure.
Figure 9:
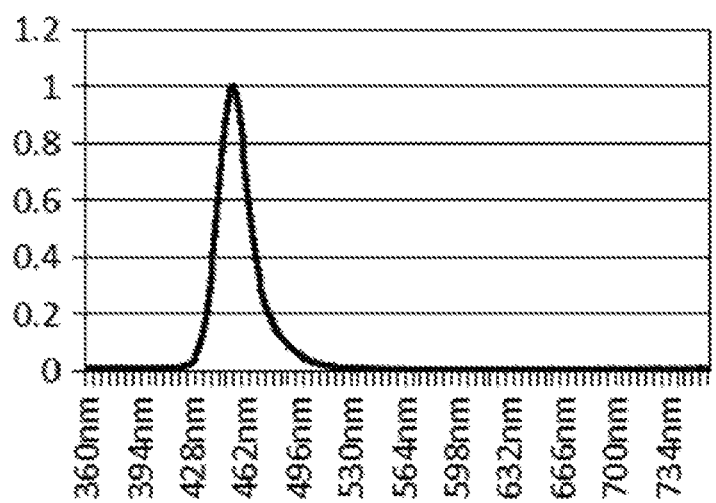
FIG. 9 shows the blue light spectrum of a light emitting device in Embodiment 4 of the present disclosure, Wherein, the aforesaid figures include the following reference numerals.

The blue light spectrum measured in Embodiment 2 is shown in FIG. 7. When the quantum dot layer (red or green) is not required to emit light, that is, only the blue electroluminescent structures are turned on through the TFT, and the emitted spectrum includes two peaks having peak ranges of 430 nm to 496 nm and 510 nm to 540 nm;

The blue light spectrum measured in Embodiment 3 is shown in FIG. 8. When the quantum dot layer (red or green) is not required to emit light, that is, only the blue electroluminescent structures are turned on through the TFT, the peak range of the emitted spectrum is mainly between 430 nm and 496 nm, with a very low intensity impurity peak between 510 nm and 540 nm appearing at the edge;

The blue light spectrum measured in Embodiment 4 is as shown in FIG. 9. When the quantum dot layer (red or green) is not required to emit light, that is, only the blue electroluminescent structures are turned on through the TFT, the peak of the emitted spectrum ranges from 430 nm to 496 nm.

By comparing the wavelength ranges in the aforesaid blue light spectra, it can be seen that when the quantum dot layer (including red quantum dots and/or green quantum dots) is not required to emit light, in Embodiment 2 not provided with first padding portions and/or second paddings, some of the blue light emitted by the electroluminescent structures leaks to the adjacent quantum dot layers to excite the adjacent quantum dot layers to emit light to enable the blending of the blue light with red or green light, thereby causing the color blending phenomenon.

From the above description, it can be seen that the aforesaid embodiments of the present disclosure achieve the following technical effects:

1. The aforesaid light emitting device of the present disclosure isolates quantum dot layers having quantum dots of different colors by a pixel isolation structure, thereby effectively preventing sub-pixels of the electroluminescent structures from exciting adjacent photoluminescent quantum dot layers to emit light;

2. A black matrix between adjacent quantum dot layers is not required for the aforesaid light emitting device of the present disclosure, thereby avoiding absorption of light by the black matrix, and improving luminous efficiency and brightness uniformity of the light emitting device;

3. The aforesaid light emitting device of the present disclosure effectively reduces the leakage of blue light by disposing first padding portion, thereby reducing the influence of the light blending phenomenon;

4. The aforesaid light emitting device of the present disclosure further reduces the leakage of blue light by further disposing second padding portion after the first padding portion is disposed, thereby further reducing the influence of the light blending phenomenon.

The foregoing descriptions are merely preferred embodiments of the present disclosure and are not intended to limit the present disclosure, and for those skilled in the art, the present disclosure may have various changes and modifications. Any modification, equivalent replacement, and improvement made in the spirit and principle of the present disclosure shall fall within the protection scope of the present disclosure.

What is claimed is:

1. A light emitting device comprises a first substrate, a pixel isolation structure, a plurality of electroluminescent structures, and a second substrate, said first substrate and said second substrate are oppositely disposed, and said second substrate is disposed on one side of said pixel isolation structure far away from said first substrate, said pixel isolation structure is disposed on the surface of one side of said first substrate, said pixel isolation structure forms a plurality of mutually isolated sub-pixel regions on the surface of said first substrate, said electroluminescent structures are disposed on a portion of said first substrate corresponding to each said sub-pixel region, wherein said sub-pixel regions further comprise:

a quantum dot layer disposed in at least one said sub-pixel region, wherein said quantum dot layer in each said sub-pixel region is located on one side of said electroluminescent structures far away from said first substrate or said quantum dot layer is located between said electroluminescent structure and said first substrate, wherein said light emitting device further comprises first padding portions, said quantum dot layer in each said sub-pixel region is located on one side of said electroluminescent structure far away from said first substrate, said first padding portion and said quantum dot layer are disposed in different sub-pixel regions, and said first padding portion is located between said first substrate and said electroluminescent structure, or said quantum dot layer in each said sub-pixel region is located between said electroluminescent structure and said first substrate, said first padding portion is disposed in the sub-pixel region having said quantum dot layer, and said first padding portion is located between said quantum dot layer and said first substrate.

2. The light emitting device according to claim 1, wherein a width of said quantum dot layer in each said sub-pixel region is greater than or equal to a width of an effective light emitting region of said electroluminescent structure.

3. The light emitting device according to claim 1, wherein said electroluminescent structure comprises a light emitting layer,
   said first padding portion and said quantum dot layer are disposed in the different sub-pixel regions, the shortest distance between the surface of said quantum dot layer and the surface of said first substrate being a first distance, the shortest distance between the surface of said light emitting layer located in the sub-pixel region as same as said first padding portion and the surface of said first substrate being a second distance, said first distance is less than or equal to said second distance, or
   said first padding portion is disposed in the sub-pixel region having said quantum dot layer, the shortest distance between the surface of said quantum dot layer and the surface of said first substrate being a first distance, the shortest distance between the surface of said light emitting layer located in the sub-pixel region different from said first padding portion and the surface of said first substrate being a second distance, said first distance is greater than or equal to said second distance.

4. The light emitting device according to claim 3, wherein said light emitting device further comprises second padding portions,
   said quantum dot layer in each said sub-pixel region is located on one side of said electroluminescent structure far away from said first substrate, said second padding portion is disposed between said second substrate and said quantum dot layer, or
   said quantum dot layer is located between said electroluminescent structure and said first substrate, said second padding portion is disposed between said electroluminescent structure and said quantum dot layer.

5. The light emitting device according to claim 1, wherein said first padding portion is a transparent insulating layer, preferably a $SiO_2$ layer or a polyimide layer.

6. The light emitting device according to claim 1, wherein said light emitting device further comprises second padding portions,
   said quantum dot layer in each said sub-pixel region is located on one side of said electroluminescent structure far away from said first substrate, said second padding portion is disposed between said second substrate and said quantum dot layer, or
   said quantum dot layer is located between said electroluminescent structure and said first substrate, said second padding portion is disposed between said electroluminescent structure and said quantum dot layer.

7. The light emitting device according to claim 6, wherein said electroluminescent structure comprises a light emitting layer, the shortest distance between the surface of said quantum dot layer and the surface of said first substrate being a first distance, the shortest distance between the surface of said light emitting layer located in the sub-pixel region different from said second padding portion and the surface of said first substrate being a third distance,
   said second padding portion is disposed between said second substrate and said quantum dot layer, said first distance is less than said third distance, or
   said second padding portion is disposed between said electroluminescent structure and said quantum dot layer located in the same sub-pixel region, said first distance is greater than said third distance.

8. The light emitting device according to claim 6, wherein said second padding portion is a transparent insulating layer, preferably a $SiO_2$ layer or a polyimide layer.

9. The light emitting device according to claim 1, wherein the emitted light of said electroluminescent structure is blue light, and said quantum dot layer has red quantum dots and/or green quantum dots.

10. The light emitting device according to claim 1, wherein said electroluminescent structure is a QLED or an OLED.

* * * * *